(12) United States Patent
Khandekar et al.

(10) Patent No.: US 7,135,771 B1
(45) Date of Patent: Nov. 14, 2006

(54) SELF ALIGNMENT FEATURES FOR AN ELECTRONIC ASSEMBLY

(75) Inventors: Viren V. Khandekar, Chandler, AZ (US); Chunho Kim, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/165,144

(22) Filed: Jun. 23, 2005

(51) Int. Cl.
*H01L 23/48* (2006.01)
*H01L 23/52* (2006.01)
*H01L 29/40* (2006.01)

(52) U.S. Cl. ............ 257/737; 257/738; 257/778; 257/786; 257/E23.021; 257/E23.023; 257/E23.069

(58) Field of Classification Search .......... 257/797, 257/E23.179; 438/975
See application file for complete search history.

(56) References Cited

U.S. PATENT DOCUMENTS

| 6,552,425 B1 * | 4/2003 | Yan et al. ............. 257/690 |
| 6,613,662 B1 * | 9/2003 | Wark et al. ............ 438/613 |
| 6,830,463 B1 * | 12/2004 | Keller ................... 439/71 |

OTHER PUBLICATIONS

McGovern, L P., et al., "High throughput low cost flip chip on board assembly processing", *Electronic Packaging & Production*, 38(2), (Feb. 1998),68-76.
Wong, C P., et al., "High performance no flow underfills for low-cost flip-chip applications", *Proceedings—47th Electronic Components and Technology Conference—IEEE*, (May 18-21, 1997),850-858.

* cited by examiner

*Primary Examiner*—Minhloan Tran
*Assistant Examiner*—Leslie Pilar Cruz
(74) *Attorney, Agent, or Firm*—Schwegman, Lundberg, Woessner & Kluth, P.A.

(57) ABSTRACT

Some embodiments of the present invention relate to an electronic assembly that includes a substrate and a die. The electronic assembly further includes an alignment bump on one of the die and the substrate and a group of mating bumps on the other of the die and the substrate. The group of mating bumps is positioned such that if the alignment bump engages each of the mating bumps, the die is appropriately positioned relative to the substrate at that location where the alignment bump engages the group of mating bumps. In some embodiments, the alignment bump extends from the substrate while in other embodiments the alignment bump extends from the die. The alignment bump on the substrate (or die) may be part of a plurality of alignment bumps such that each alignment bump engages a different group of mating bumps on the die (or substrate).

16 Claims, 5 Drawing Sheets

50

60

ENGAGING AN ALIGNMENT BUMP THAT EXTENDS FROM ONE DIE AND A SUBSTRATE WITH A GROUP OF MATING BUMPS THAT EXTENDS FROM THE OTHER OF THE DIE AND THE SUBSTRATE TO ALIGN THE DIE RELATIVE TO THE SUBSTRATE WHERE THE ALIGNMENT BUMP ENGAGES THE GROUP OF MATING BUMPS

- ENGAGING AN ELECTRONIC PACKAGE THAT INCLUDES THE DIE WITH A MOTHERBOARD

- ENGAGING THE ALIGNMENT BUMP WITH AT LEAST ONE OF THE MATING BUMPS IN THE GROUP OF MATING BUMPS BEFORE THE CONTACT BUMPS ON THE DIE ENGAGE THE CONTACT BUMPS ON THE SUBSTRATE

- PRESSING THE ALIGNMENT BUMP AGAINST AT LEAST ONE OF THE MATING BUMPS IN GROUP OF MATING BUMPS BEFORE THE CONTACT BUMPS ON THE DIE ENGAGE THE CONTACT BUMPS ON THE SUBSTRATE

- ENGAGING THE ELONGATED MEMBER WITH A GROUP OF MATING BUMPS THAT ARE LINEARLY ARRANGED

- ENGAGING A PLURALITY OF ALIGNMENT BUMPS WITH A PLURALITY OF GROUPS OF MATING BUMPS SUCH THAT EACH ALIGNMENT BUMP ENGAGES A SEPARATE GROUP OF MATING BUMPS

65

BONDING A PLURALITY OF CONTACT BUMPS ON THE DIE WITH A PLURALITY OF CONTACT BUMPS ON THE SUBSTRATE

- REFLOWING THE CONTACT BUMPS AND CURING AN UNDERFILL THAT IS BETWEEN THE SUBSTRATE AND THE DIE

- PRESSING THE PLURALITY CONTACT BUMPS ON THE DIE AGAINST THE PLURALITY CONTACT BUMPS ON THE SUBSTRATE

*Fig. 7*

SELF ALIGNMENT FEATURES FOR AN ELECTRONIC ASSEMBLY

TECHNICAL FIELD

Some example embodiments of the present invention relate to the packaging of electronic components, and more particularly, to soldering an electronics package that includes a die to a motherboard.

BACKGROUND

The current paths in electronic assemblies that include processors are continually being required to handle ever-increasing amounts of current in order to power the processors. Processors typically require more power in order to operate at higher frequencies and to simultaneously perform numerous logic and memory operations. As processor power densities continue to increase, so too does the structural and thermal challenge of adhering electronic packages that include dies to a substrate (e.g., a motherboard).

One example method of attaching a die to a substrate includes soldering the die to the substrate and then injecting an underfill between the die and the substrate. Capillary flow causes the underfill to seal the area between the die and the substrate that is not occupied by the soldered areas of connection.

One drawback with soldering the die to the substrate is that the various components contract at different rates during bonding. Since the die, solder and substrate contract at different rates, stress forms within the die, solder and substrate as the solder hardens to bond the die to the substrate. In addition, placing the underfill between the die and the substrate after solder bonding serves to lock in the stress within the various components. The stress that exists within such assemblies may cause cracks within the die, solder and/or substrate.

The stress within the various components makes the electronic assemblies vulnerable to unwanted cracking, especially when a motherboard is mounted within a chassis that is shipped to an end user. The shock and vibration forces that are generated during shipping can be particularly detrimental to such electronic assemblies.

One recent method of attaching a die to a substrate includes thermal compression bonding (TCB) the die to the substrate. A typical TCB process includes covering solder balls on a substrate with an underfill and then positioning solder balls on a chip against the solder balls on the substrate. Heat and a force are simultaneously applied to the solder balls over a period of time to cause simultaneous solder interconnect reflow and underfill cure. One of the advantages of TCB over a conventional capillary flow process is that the extra processing steps that are associated with a capillary flow process (e.g., flux application, flux residue cleaning and secondary thermal curing of the underfill) are eliminated.

Despite numerous processing advantages TCB presently suffers from a major drawback in that the interconnect yield rate of the soldered connections is very low when fillers are contained in the underfill material. A significant amount of filler is typically required in an underfill material in order improve the reliability of the connection between a die and a substrate. As an example, reliability tests show that at least 50 percent by weight of fillers is required in an underfill in order to improve solder joint reliability.

The interconnect yield rate is typically lower than desired because the fillers which are normally used in the underfill are made of a relatively hard material that tends to become entrapped between the die and substrate bumps (or pads). This entrapment of the fillers/underfill sometimes prevents the die bumps from making adequate contact with substrate bumps such that solder joints are unable to properly form.

There have been attempts to address the filler entrapment problem by forming the die and substrate bumps with rounded tips. However, the rounded tips cause other concerns in that the rounded die bumps tend to slip over the rounded solder bumps as a force is applied during the TCB bonding process. This slipping between the rounded die and substrate bumps can cause the die and the substrate to become misaligned. The die and the substrate can become so misaligned that the interconnect yield rate between the die bumps and the substrate bumps may be adversely effected.

BRIEF DESCRIPTION OF THE DRAWINGS

FIG. 7 is a flow diagram illustrating an example method of aligning a die relative to a substrate.

DETAILED DESCRIPTION

The following detailed description references the accompanying drawings. Like numerals describe substantially similar components throughout each of the drawings. Other embodiments may be used, and structural, logical, and electrical changes made. The integrated circuit described herein can be manufactured, used, or shipped in a number of positions and orientations.

Figure 1:
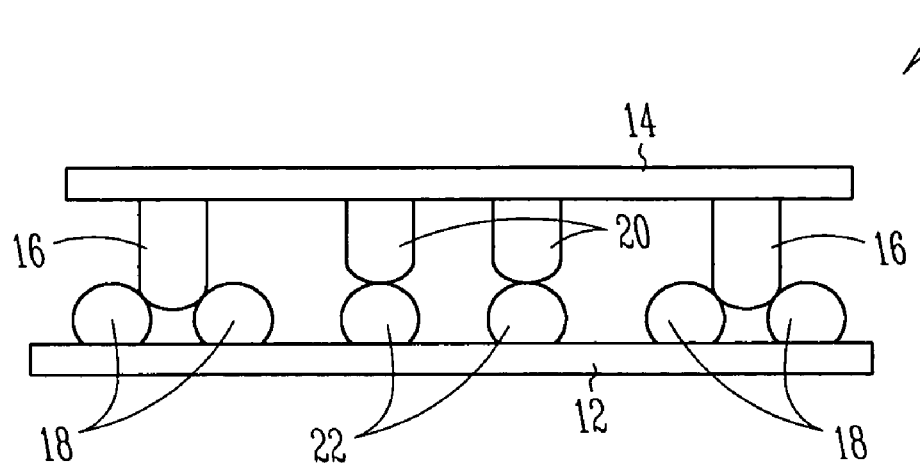
FIG. 1 illustrates an example embodiment of an electronic assembly that includes a die bonded to a substrate.
Figure 2:
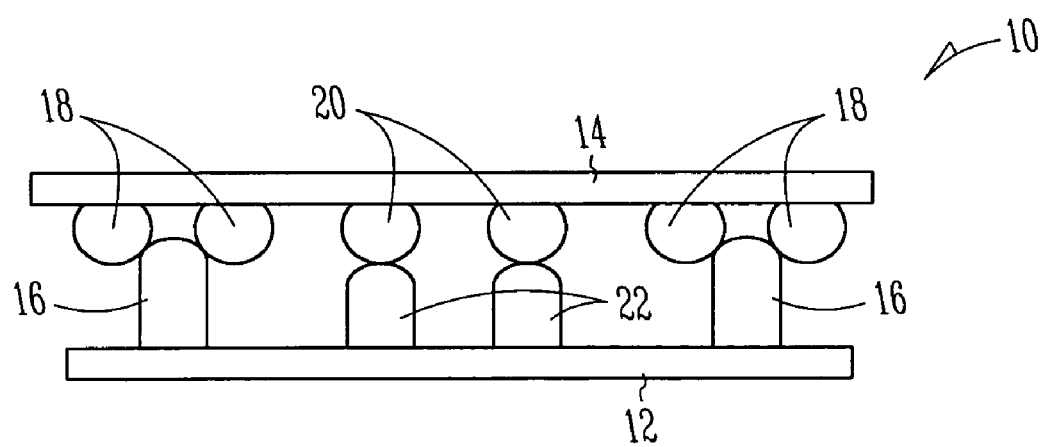
FIG. 2 illustrates another example embodiment of an electronic assembly that includes a die bonded to a substrate.

FIGS. 1 and 2 illustrate an electronic assembly 10 that includes a substrate 12 and a die 14. The electronic assembly 10 further includes an alignment bump 16 on one of the die 14 and the substrate 12 and a group of mating bumps 18 on the other of the die 14 and the substrate 12. The group of mating bumps 18 is positioned such that if an alignment bump 16 engages each mating bump 18 in a group of mating bumps 18, the die 14 is appropriately positioned relative to the substrate 12 at that location where the alignment bump 16 engages the group of mating bumps 18.

FIG. 1 shows an example embodiment where the alignment bump 16 extends from the die 14 while FIG. 2 shows an example embodiment where the alignment bump 16 extends from the substrate 12. The alignment bump 16 and the mating bumps 18 may have any size, configuration or orientation as long the alignment bump 16 engages each mating bump 18 in the group of mating bumps 18 when the die 14 is appropriately positioned relative to the substrate 12. It should be noted that the alignment bump 16 and the mating bumps 18 may or may not be used to carry signals to and/or from the die 14 and/or provide power to the die 14.

Although it is not clearly illustrated in FIGS. 1 and 2, the substrate may be part of a motherboard and the die 14 may part of an electronic package. In addition, the die 14 and the substrate 12 may be at least partially encapsulated by a protective material (not shown in FIGS. 1 and 2). Die 14 may be made of semiconducting, non-semiconducting, or combinations of semiconducting and non-semiconducting materials.

The substrate 12 may be formed of one layer or multiple layers. In addition, the substrate 12 may include conductive traces that electrically connect the alignment bump 16 (or the mating bumps 18 in other embodiments) to the die 14 and/or to other electronic components.

It should be noted that die 14 may be a processor of any type. As used herein, processor means any type of circuit such as, but not limited to, a microprocessor, a microcontroller, a graphics processor or a digital signal processor. Die 14 may also be a custom circuit or an application-specific integrated circuit, such as a communications circuit for use in wireless devices such as cellular telephones, pagers, portable computers, two-way radios, and similar electronic systems. In addition, the die 14 may be a type of memory device (e.g., a flash memory or a non-volatile memory).

Figure 3:
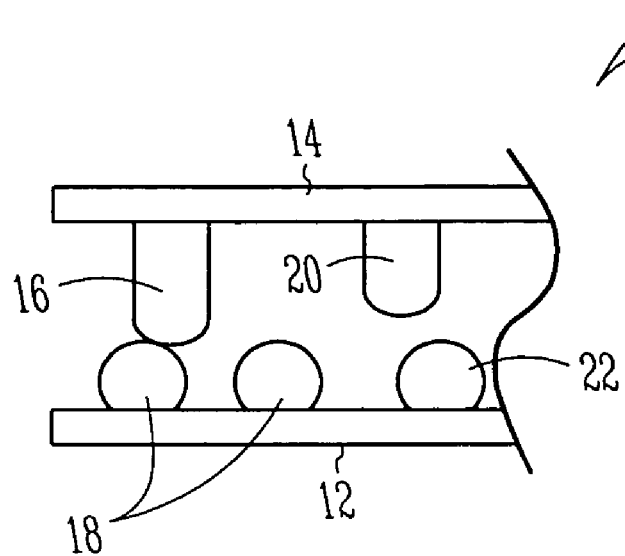
FIGS. 3–4 are enlarged views illustrating a portion of the electronic assembly shown in FIG. 1.
Figure 4:
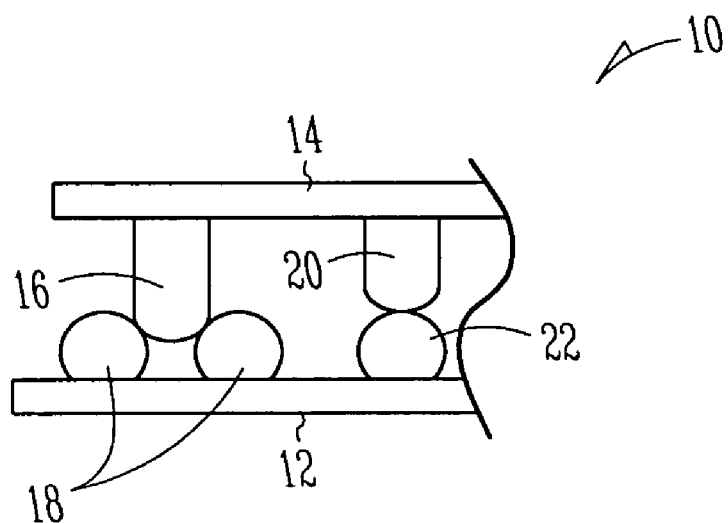

In the example embodiments that are illustrated in FIGS. 1 and 2, the die 14 includes a plurality of contact bumps 20 that are bonded to a plurality of contact bumps 22 on the substrate 12. As shown most clearly in FIGS. 3 and 4, the alignment bump 16 may be higher than the plurality of contact bumps 20 (or 22) such that the alignment bump 16 engages at least one of the mating bumps (FIG. 3) before the plurality of contact bumps 20 on the substrate 12 engages the plurality of contact bumps 22 on the die 14 (FIG. 4). FIGS. 3 and 4 show that the alignment bump 16 and one or more of the mating bumps 18 tend to maneuver the die 14 into alignment as the plurality of contact bumps 20 on the die 14 are moved toward the plurality of contact bumps 22 on the substrate 12.

In other embodiments (not shown in Figures), the mating bumps 18 may be higher than the plurality of contact bumps 20 (or 22) such that at least one of the mating bumps 18 engages the alignment bump 16 before the plurality of contact bumps 20 on the substrate 12 engages the plurality of contact bumps 22 on the die 14. The determination as to whether the alignment bump 16, the mating bumps 18 or both the alignment bump 16 and the mating bumps 18 are higher than the plurality of contact bumps 20 (or 22) on the die 14 and substrate 12 will depend on manufacturing considerations and the application where the electronic assembly 10 is to be used (among other factors).

Figure 5:
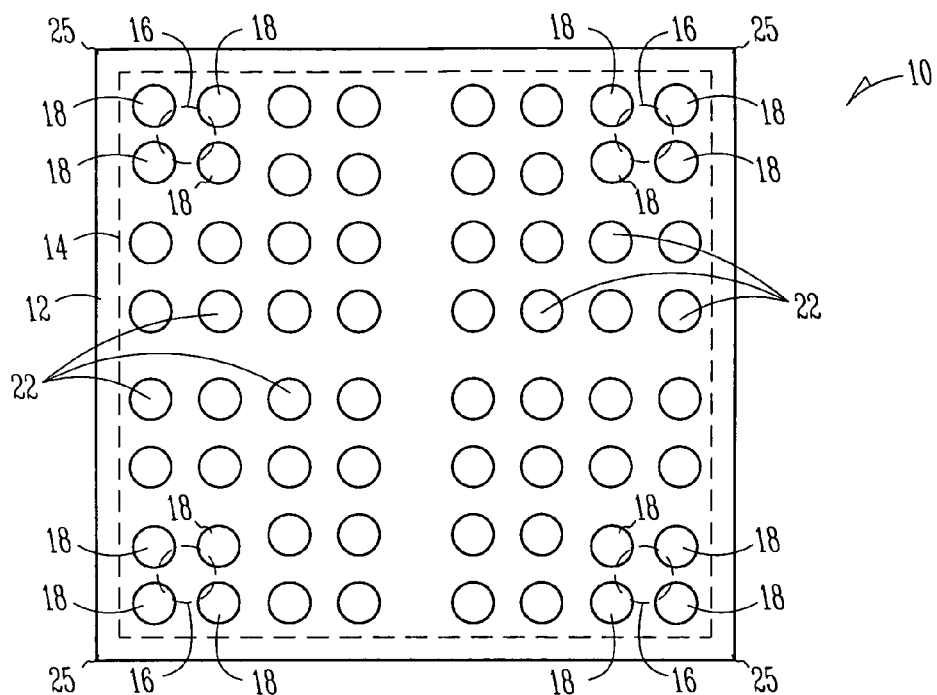
FIG. 5 is a top view of the electronic assembly shown in FIG. 1 with the die shown in phantom lines.

FIG. 5 is a top view of the electronic assembly shown in FIG. 1 with portions of the die 14 shown in phantom lines. The electronic assembly 10 includes a plurality of alignment bumps 16 on the die 14 and a plurality of groups of mating bumps 18 on the substrate 12. In some embodiments, the plurality of alignment bumps 16 may extend from the substrate 12 instead of the die 14. In other embodiments, the plurality of alignment bumps 16 may extend from both the substrate 12 and the die 14.

The plurality of groups of mating bumps 18 are positioned such that if each alignment bump 16 engages each mating bump 18 in each respective group of mating bumps 18, the die 14 is appropriately positioned relative to the substrate 12. In some embodiments, each alignment bump 16 is higher than the plurality of contact bumps 20 such that each alignment bump 16 engages at least one of the mating bumps 18 in each group of mating bumps 18 before the plurality of contact bumps 20 on the substrate 12 engages the plurality of contact bumps 22 on the die 14. In other embodiments (not shown), each mating bump 18 in the plurality of groups of mating bumps 18 is higher than the plurality of contact bumps 22 such that at least one of the mating bumps 18 in each group of mating bumps 18 engages the respective alignment bumps 16 before the plurality of contact bumps 20 on the substrate 12 engages the plurality of contact bumps 22 on the die 14.

In the example embodiment illustrated in FIG. 5, each group of mating bumps 18 includes four mating bumps 18, although three or more mating bumps 18 may be used. In addition, the substrate 12 may include at least two groups of mating bumps 18 (four are shown in FIG. 5), although any number of groups of mating bumps 18 may be used as long as the groups of mating bumps 18 provide rotational and translational alignment of the die 14 relative to the substrate 12. As an example, FIG. 5 shows that the substrate 12 (or the die 14 in other embodiments) includes four corners 25 such that a group of mating bumps 18 is positioned near each corner 25.

Figure 6:
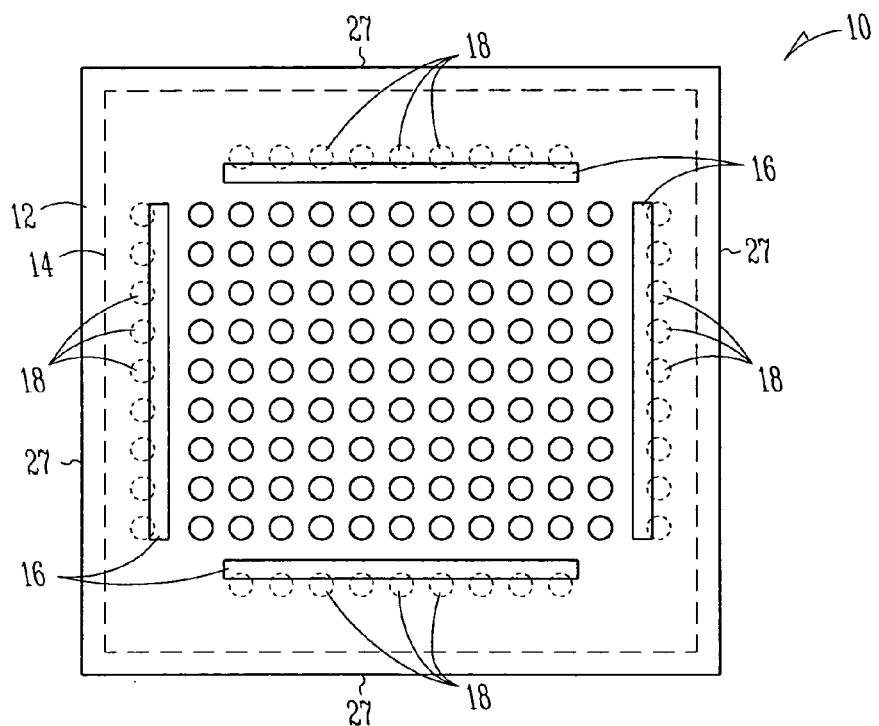
FIG. 6 is a top view similar to FIG. 5 showing another example electronic assembly with the die shown in phantom lines.

FIG. 6 is a top view similar to FIG. 5 which shows an example embodiment where the alignment bump 16 is an elongated member on the substrate 12 and the mating bumps 18 are arranged in a line on the die 14. In the illustrated example embodiment, the substrate 12 (or the die 14 in other embodiments) includes a plurality of elongated members 16. The mating bumps 18 in each group of mating bumps may be arranged in a line such that if the elongated members 16 engage a respective group of mating bumps 18, the die 14 is appropriately positioned relative to the substrate 12.

In the example embodiment illustrated in FIG. 6, each group of mating bumps 18 includes nine mating bumps 18, although any number of mating bumps 18 may be used as long as there are at least two mating bumps 18 in each group of mating bumps 18. The substrate 12 (or the die 14 in other embodiments) may include at least two groups of mating bumps 18 (four are shown in FIG. 6), although any number of groups of mating bumps 18 may be used as long as the groups of mating bumps 18 provide rotational and translational alignment of the die 14 relative to the substrate 12. As an example, FIG. 6 shows that the substrate 12 includes four sides 27 such that a group of mating bumps 18 is positioned near each side 27 of the substrate 12.

In other embodiments (not shown), each group of mating bumps 18 may be distributed arbitrarily throughout the plurality of contacts 20 on the die 14. Therefore, the alignment bumps 16 on the substrate 12 may be correspondingly distributed arbitrarily throughout the plurality of contacts 22 on the substrate 12.

The alignment and mating members 16, 18 may be made from the same material or different materials. Some example materials for the alignment and mating members 16, 18 include gold, silver, copper, tin, solder and alloys comprised of any combination of tin, bismuth, lead and/or indium. The types of materials that are selected for the alignment and mating members 16, 18 will depend on the application where the electronic assembly 10 is to be used.

In the example embodiment shown in FIGS. 1 and 2, the plurality of contacts 22 on the die 14 are bumps and the plurality of contacts 20 on the substrate 12 are bumps. It should be noted that the plurality of contacts 20 on the die 14 and the plurality of contacts 22 on the substrate 12 may be any size, shape or geometry that permits the die 14 to be bonded to substrate 12.

In some embodiments, the electronic assembly 10 may further include an underfill (not shown) that is between the die 14 and the substrate 12 to facilitate bonding the die 14 to the substrate 12. The underfill may be positioned between the die 14 and the substrate 12 as part of a capillary flow process or a thermal compression bonding process. The underfill may contain one or more fillers that are added to the underfill to improve the reliability of the connection between a die and a substrate. As an example, the underfill may include at least 50 percent by weight of fillers.

The size, type and alignment of the die 14, or an electronic package that includes the die 14, may vary depending on the design of electronic assembly 10. In addition, the components in the electronic assembly 10 will be determined based on the space available and the application where electronic assembly 10 is to be used (among other factors).

FIG. 7 illustrates one example embodiment of a method 50. The method 50 includes 60 engaging an alignment bump that extends from one of a die and a substrate with a group of mating bumps that extends from the other of the die and the substrate to align the die relative to the substrate where the alignment bump engages the group of mating bumps. The method further includes 65 bonding a plurality of contact bumps on the die with a plurality of contact bumps on the substrate.

In some embodiments, 65 bonding a plurality of contact bumps on the die with a plurality of contact bumps on the substrate may include (i) reflowing the contact bumps and curing an underfill that is between the substrate and the die; and/or (ii) pressing the plurality of contact bumps on the die against the plurality of contact bumps on the substrate (e.g., in a TCB process). In addition, 65 engaging an alignment bump that extends from one of the die and the substrate with a group of mating bumps that extends from the other of the die and the substrate may include (i) engaging an electronic package that includes the die with a motherboard; and/or (ii) engaging an elongated member with a group of mating bumps that are linearly arranged.

It should be noted that 65 engaging an alignment bump with a group of mating bumps may include engaging the alignment bump with at least one of the mating bumps in the group of mating bumps (e.g., by pressing the alignment bump against one or more of the mating bumps) before the contact bumps on the die engage the contact bumps on the substrate. In some embodiments, 65 engaging an alignment bump with a group of mating bumps may include engaging a plurality of alignment bumps with a plurality of groups of mating bumps such that each alignment bump engages a separate group of mating bumps.

Figure 8:
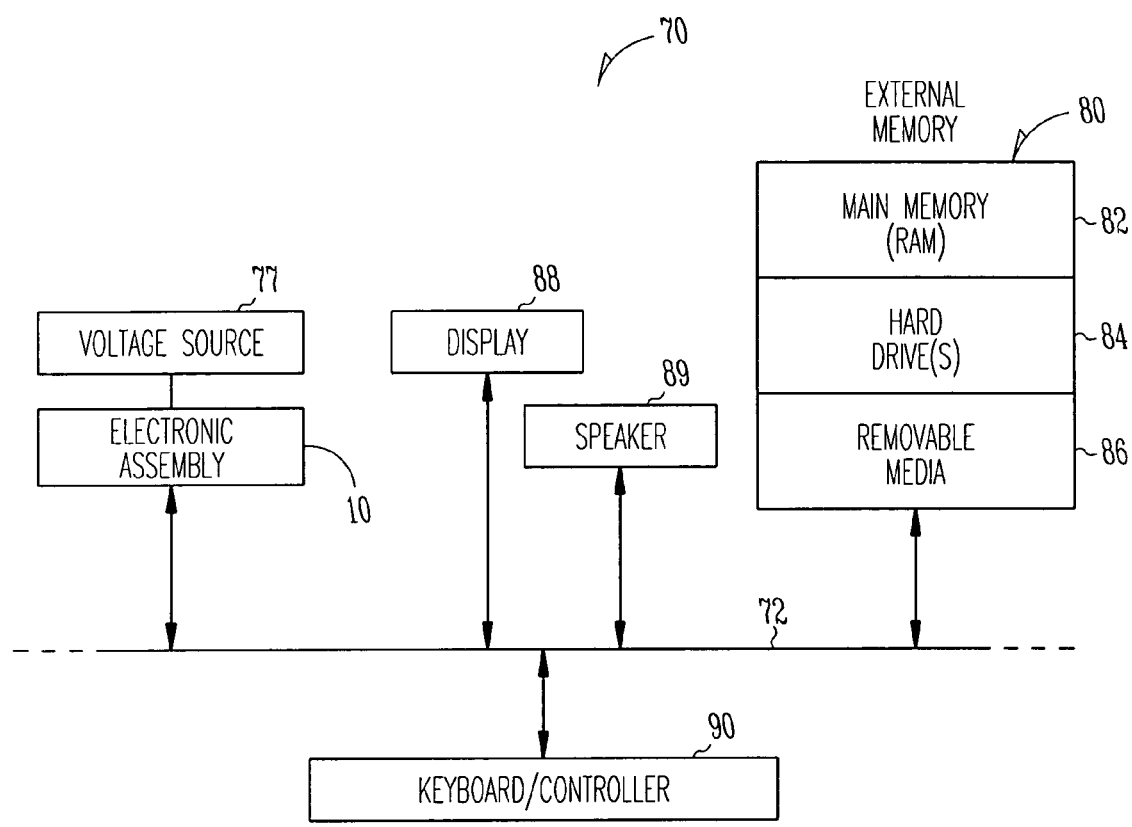
FIG. 8 is a schematic diagram of an electronic system that incorporates an electronic assembly.

FIG. 8 is a schematic diagram of an electronic system 70 incorporating at least one electronic assembly (e.g., electronic assembly 10 shown in FIG. 1 or FIG. 2) described herein. Electronic system 70 may be a computer system that includes a system bus 72 which electrically couples the various components of electronic system 70 together. System bus 72 may be a single bus or any combination of busses.

Electronic assembly 10 is electrically coupled to system bus 72 and as discussed above may include any circuit, or combination of circuits. Electronic system 70 may also include an external memory 80 that in turn may include one or more memory elements suitable to a particular application. Some example memory elements include a main memory 82 in the form of random access memory (RAM), one or more hard drives 84, and/or one or more drives that handle removable media 86, such as diskettes, compact disks (CDs) and digital video disks (DVDs). The electronic system 70 may also include a display device 88, a speaker 89, and a controller 90, such as a keyboard, mouse, trackball, game controller, microphone, voice-recognition device, or any other device that inputs information into the electronic system 70.

In some embodiments, electronic system 70 further includes a voltage source 77 that is electrically coupled to electronic assembly 10. Voltage source 77 may be used to supply power to a die (e.g., a processor) that is within electronic assembly 10.

The methods and electronic assemblies described herein may be implemented in a number of different embodiments, including an electronic package, an electronic system, a computer system, and one or more methods of fabricating an electronic assembly. The elements, materials, geometries, dimensions, and sequence of operations can all be varied to suit particular packaging requirements.

FIGS. 1–8 are merely representational and are not drawn to scale. Certain proportions thereof may be exaggerated while others may be minimized.

The electronic assembly and method described above may provide a solution for bonding an electronic package to a motherboard, especially thermal compression bonding an electronic package that includes a die to a motherboard. Many other embodiments will be apparent to those of skill in the art from the above description.

What is clamed is:

1. An electronic assembly comprising:
    a substrate that includes a plurality of contact bumps;
    a die that includes a plurality of contact bumps which engages the plurality of contact bumps on the substrate;
    an alignment bump on one of the die and the substrate; and
    a group of mating bumps on the other of the die and the substrate, the group of mating bumps being positioned such that if the alignment bump engages each mating bump in the group of mating bumps, the die is appropriately positioned relative to the substrate where the alignment bump engages the mating bumps, wherein the alignment bump is higher than the plurality of contact bumps such that the alignment bump engages at least one of the mating bumps before the plurality of contact bumps on the substrate engages the plurality of contact bumps on the die.

2. The electronic assembly of claim 1 wherein the group of mating bumps includes at least three mating bumps.

3. The electronic assembly of claim 1 wherein one of the die and the substrate includes at least two groups of mating bumps and the other of the die and substrate includes an alignment bump for each group of mating bumps.

4. An electronic assembly comprising:
    a substrate that includes a plurality of contact bumps;
    a die that includes a plurality of contact bumps which engages the plurality of contact bumps on the substrate;
    a plurality of alignment bumps on one of the die and the substrate; and
    a plurality of groups of mating bumps on the other of the die and the substrate, the plurality of groups of mating bumps being positioned such that if each alignment bump engages each mating bump in each respective group of mating bumps, the die is appropriately positioned relative to the substrate, wherein each alignment bump is higher than the plurality of contact bumps such that each alignment bump engages at least one of the mating bumps in each group of mating bumps before the plurality of contact bumps on the substrate engages the plurality of contact bumps on the die.

5. The electronic assembly of claim 4 wherein each group of mating bumps includes at least three mating bumps.

6. The electronic assembly of claim 4 wherein both the die and the substrate each include at least one group of mating bumps and at least one alignment bump.

7. An electronic assembly comprising:
a substrate that includes a plurality of contact bumps;
a die that includes a plurality of contact bumps which engages the plurality of contact bumps on the substrate;
an alignment bump on one of the die and the substrate; and
a group of mating bumps on the other of the die and the substrate, the group of mating bumps being positioned such that if the alignment bump engages each mating bump in the group of mating bumps, the die is appropriately positioned relative to the substrate where the alignment bump engages the mating bumps, wherein the alignment bump is an elongated member and the mating bumps are arranged in a line.

8. The electronic assembly of claim 7 wherein the group of mating bumps includes at least two mating bumps.

9. The electronic assembly of claim 7 wherein the group of mating bumps is on one side of the elongated member.

10. An electronic assembly comprising:
a substrate that includes a plurality of contact bumps;
a die that includes a plurality of contact bumps which engages the plurality of contact bumps on the substrate;
a plurality of alignment bumps on one of the die and the substrate, each of the alignment bumps being an elongated member; and
a plurality of groups of mating bumps on the other of the die and the substrate, the mating bumps in each group of mating bumps being arranged in a line such that if the elongated members engage a respective group of mating bumps, the die is appropriately positioned relative to the substrate.

11. The electronic assembly of claim 10 wherein each group of mating bumps includes at least two bumps.

12. The electronic assembly of claim 10 wherein one of the die and the substrate includes at least four groups of mating bumps.

13. The electronic assembly of claim 12 wherein one of the die and the substrate includes four sides such that a group of mating bumps is positioned near each side.

14. An electronic system comprising:
a bus;
a random access memory coupled to the bus; and
an electronic assembly coupled to the bus, the electronic assembly including a substrate, a die and an alignment bump on one of the die and the substrate, the electronic assembly further including a group of mating bumps on the other of the die and the substrate, the group of mating bumps being positioned such that if the alignment bump engages each mating bump in the group of mating bumps, the die is appropriately positioned relative to the substrate where the alignment bump engages the group of mating bumps, wherein the die includes a plurality of contact bumps that are bonded to a plurality of contact bumps on the substrate, the alignment bump being higher than the plurality of contact bumps such that the alignment bump engages at least one of mating bumps before the plurality of contact bumps on the substrate engages the plurality of contact bumps on the die.

15. The electronic system of claim 14 further comprising a voltage source electrically coupled to the die.

16. The electronic system of claim 14 wherein the substrate is a motherboard and the die is part of an electronic package.

* * * * *